METHOD FOR SPUTTER ETCHING USING A HIGH FREQUENCY NEGATIVE PULSE TRAIN

Filed Jan. 4, 1967 4 Sheets-Sheet 1

INVENTORS P. A. BYRNES, JR.
M. P. LEPSELTER
BY
Sylvan Sherman
ATTORNEY

Nov. 18, 1969 P. A. BYRNES, JR., ET AL 3,479,269

METHOD FOR SPUTTER ETCHING USING A HIGH FREQUENCY NEGATIVE PULSE TRAIN

Filed Jan. 4, 1967 4 Sheets-Sheet 4

1

3,479,269

METHOD FOR SPUTTER ETCHING USING A HIGH FREQUENCY NEGATIVE PULSE TRAIN

Peter A. Byrnes, Jr., Bridgewater Township, Somerset County, and Martin P. Lepselter, New Providence, N.J., assignors to Bell Telephone Laboratories, Incorporated, Murray Hill, N.J., a corporation of New York Filed Jan. 4, 1967, Ser. No. 607,203
Int. Cl. C23c *15/00*
U.S. Cl. 204—192 9 Claims

ABSTRACT OF THE DISCLOSURE

Thin films of material are etched or cleaned by placing them in a low pressure gas ambient, forming a plasma in the ambient, and establishing a periodic voltage between the films and the plasma. When one or more dielectric layers are present among the thin films, the waveform of the periodic voltage is chosen to produce etching without breakdown of the dielectric layers. A negative pulse voltage with its peak value chosen with reference to the etching yield curve of the material is a particularly useful waveform. One application of the process is the formation of an atomically clean bond between two layers of material. Apparatus for producing etching and for forming atomically clean bonds is also described.

This invention relates to cleaning or etching by cathodic back sputtering. More specifically, it concerns a method for cleaning or etching which utilizes a periodic voltage to extract bombarding ions from a plasma.

Since the dimensions of microelectronic devices and circuits are measured in thousandths of an inch, precise methods of etching and cleaning are of considerable importance in their fabrication. Various techniques, including chemical etching and indirect back sputtering have been adapted for use in microelectronic fabrication processes, but these methods have important limitations.

Chemical etching, such as is described by Schlabach and Rider in Printed and Integrated Circuitry (1963) at p. 83 et seq. is one commonly used etching or cleaning method. However, there are at least three difficulties associated with this approach. First, because the eroding action proceeds at a different rate as the etching depth increases, chemical etching generally produces cross sections that are either undercut or slope-sided rather than rectilinear. Second, since different materials react differently to the same etchant, chemical etching becomes a time-consuming, multi-step process when it is necessary to etch through several layers of different materials; and, third, chemical etching is not useful with certain materials, such as iridium and rhodium, because of their high resistivity to chemical action.

A second approach to etching and cleaning, which is of particular value in the fabrication of microelectronic circuits and devices, is positive ion bombardment. When positive ions, moving at high velocities, collide with the surface of a workpiece, they remove material from it. Thus, for example, the workpiece may be etched or cleaned by placing it on a cathode in a low pressure noble gaseous ambient and applying a high constant voltage between the cathode and an anode. Ions, which are formed by collisions between electrons accelerated from the cathode and noble gas atoms, are accelerated toward the cathode where they bombard the workpiece surface.

Present methods utilizing ion bombardment are, however, of limited utility in the etching or cleaning of workpieces containing thin films of dielectric materials or other materals which cannot be subjected to high, constant voltages without damage. Typically, the voltages required to form ions and obtain etching are in excess of

2 the breakdown voltage of thin dielectric films. And while the problem of breakdown may be overcome by placing an insulating layer between the workpiece and the cathode (see M. P. Lepselter, Patent No. 3,271,286, dated Sept. 6, 1966), the efficiency of the process is greatly reduced by the presence of an insulator because the electric field must be bent around it. As a result, the etching is produced by bombardment of stray ions from the surrounding field rather than by ions attracted directly to the workpiece, and is less satisfactory.

The method for etching or cleaning, in accordance with the present invention, comprises, in brief, the steps of placing the workpiece in a low pressure noble gas ambient, forming a plasma in the ambient, and effecting the bombardment of the surface by ions drawn from the plasma by the establishment of a periodic voltage between the workpiece and the plasma. This method is particularly useful in the subsequent formation of an atomically clean bond between a surface of the workpiece and some other material.

When it is desired to deposit a layer of material on the surface of a workpiece, the formation of an atomically clean bond is important because of greater adherence and greatly increased uniformity in its electrical properties. One difficulty typically encountered in depositing a layer of material on a metal or semiconductor workpiece surface is the formation of an unwanted, thin, oxide-like surface layer on the workpiece surface prior to deposition. Typically, such a surface layer forms immediately after cleaning when the substrate is exposed to air, and forms even at moderate vacuums so low as $10^{-6}$ torr. The presence of the surface layer prevents uniform reaction between the deposited material and the workpiece because the reaction must take place through randomly distributed voids in the surface layer. But when the intervening surface layer is eliminated, more uniform depositions may be obtained. The result is to produce more uniform ohmic and rectifying contacts. (See Kahng & Lepselter, Planar Epitaxial Silicon Schottky Barrier Diodes, Bell System Technical Journal 44:1525, 1965)

While the advantages of atomically clean bonds are known, previously devised methods of forming them are of only limited utility in the fabrication of microelectronic devices. One method of forming such a bond is cleaving a sample of material in a vacuum and depositing a layer of material on the freshly cleaved surface. It is, however, impractical to cleave the surface of a workpiece containing layers of material as thin as those typically encountered in microelectronics. A second method is vacuum heating a sample of material to a very high temperature and then depositing a layer of material on it. A difficulty with this approach, however, is that the intense heat pits oxide layers and destroys the properties of delicate junctions.

In accordance with an important use of the invention, an atomically clean bond is formed by cleaning the workpiece surface utilizing ionic bombardment and then depositing a layer of material upon the freshly cleaned surface.

The invention may now be described in greater detail by reference to the accompanying drawings wherein.

Similar reference characters are applied to similar elements throughout all the drawings.

Figures 1, 2:
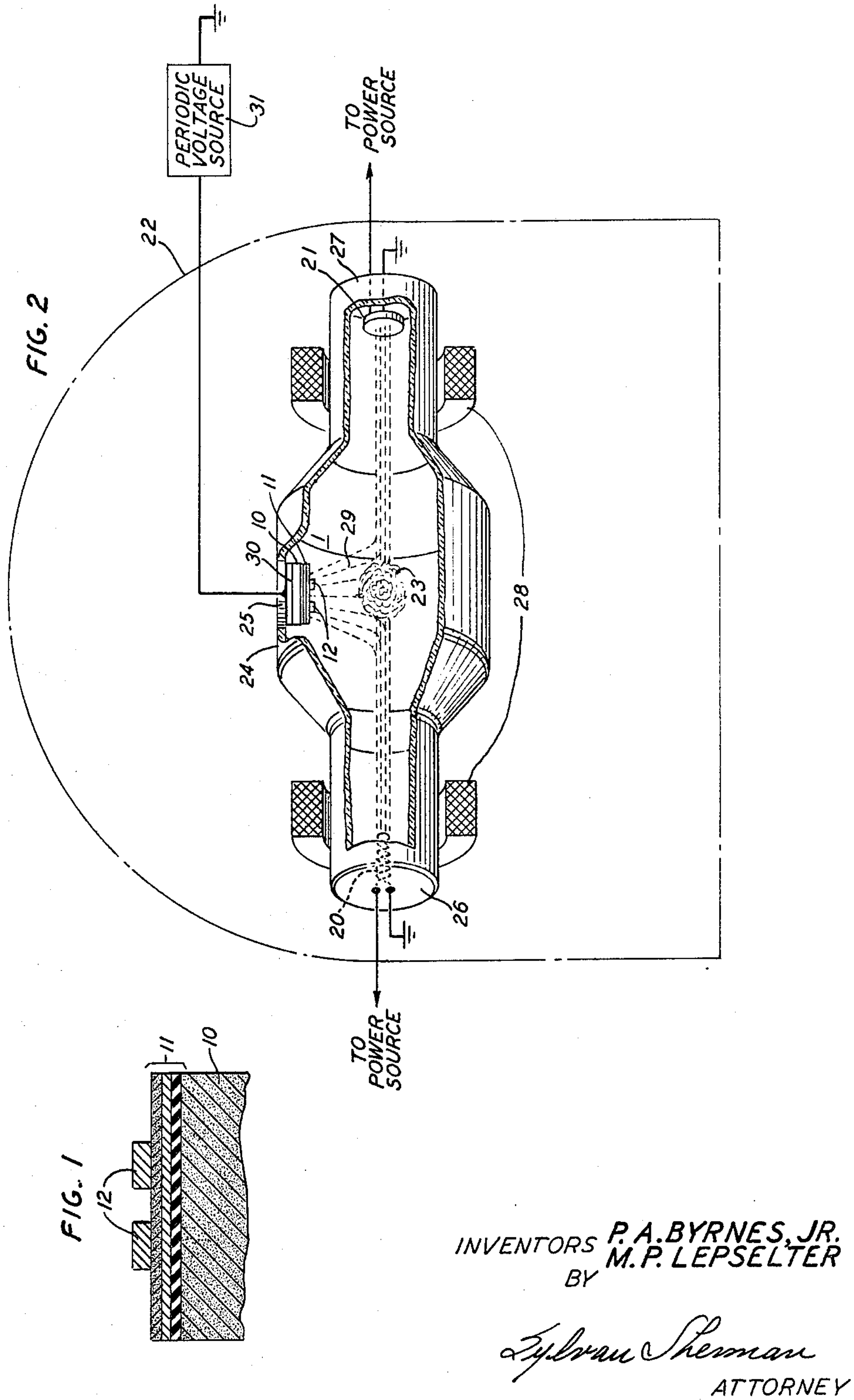
FIG. 1 is a cross section of a typical workpiece to be etched or cleaned in accordance with the invention.
FIGS. 2, 5, 6 and 8 show various forms of apparatus which may be used for the practice of the invention.

In FIG. 1 is shown a cross section of a typical workpiece. Typically, it comprises a relatively thick substrate 10 such as, for example, a silicon wafer, supporting a thin film of material 11. The thin film typically comprises several layers which have been deposited in succession upon the surface. These layers may be dielectrics, semiconductors, conductors or even ferrites. Also shown is a masking layer 12 which may be formed by known techniques, such as the well-known photo-resist method, to protect areas of the surface which are not to be etched. In typical applications the thin film 11 is a few ten-thousandths of an inch thick or smaller with the thickness of the individual layers being a few hundred-thousandths of an inch.

Reference is now made to FIG. 2 which is a schematic illustration of apparatus used to practice the invented method.

The workpiece, along with an electron-emitting filament or cathode 20 and an anode 21, is placed within a vacuum chamber 22. In one typical arrangement the filament was placed approximately five inches from the anode and the workpiece was positioned two inches from the filament-anode line. The chamber is also provided with apparatus (not shown) for evacuating it and injecting a suitable gaseous ambient into it. Since a plasma 23 is to be formed between the filament and the anode, structure for containing a plasma and, incidentally, for supporting the workpiece in proper relationship to the plasma, is advantageously provided. In the apparatus of FIG. 2, a quartz container 24, having suitably located apertures 25, 26 and 27 for the workpiece, filament and anode, respectively, is provided for this purpose. Additionally, apparatus for establishing a longitudinal magnetic field along the filament-anode direction, such as, for example, ring magnets 28, are provided in order to control the plasma. Terminals extending through chamber 22 are also provided for connecting the filament and the anode to external power supplies (not shown) and for connecting the workpiece to a periodic voltage power supply 31.

Using the above-described apparatus, a workpiece is etched in accordance with the invention, by the steps of evacuating the chamber, introducing a noble gas ambient, forming a plasma between the filament and the anode, and applying an appropriate periodic voltage between the workpiece and the plasma, as is now explained in greater detail hereinbelow.

With the various members in place, the workpiece is surrounded with a noble gas ambient which can be ionized to form a plasma. While argon is typically used, any noble gas will work. The reason a noble gas is used is to prevent unwanted chemical reactions between the ambient and the thin film. Ambient pressures between about one-half micron and several hundred microns have been found to be useful. As an exception to the ordinary practice of using ambients comprised solely of noble gases, it has been that the etching rate of oxidizable metals, such as titanium, for example, can be controlled by "bleeding" oxygen into the ambient. Typically the partial pressure of the oxygen is about 1 to 5% that of the noble gas. The oxide layer which forms on the metal etches more slowly than the pure metal, thus slowing the etching rate. Other non-noble gases which react with the particular material of the thin film surface to form slowly etching compounds can be similarly used.

A plasma 23 is formed in the ambient between the filament 20 and the anode 21 by heating the filament by a current derived from an external power supply and by applying a constant voltage between the filament and the anode as provided by another external power supply. The plasma is formed by collisions between electrons emitted from the heated filament and atoms of the gaseous ambient. Ring magnets 28, which establish a longitudinal magnetic field, are used to control the shape of the plasma.

Etching of the thin films 11 is produced by applying an alternating voltage derived from an external power source 31, between the workpiece and the filament-anode system. When the workpiece is at a negative potential with respect to the plasma, positive ions 29 are drawn out of the plasma and toward the workpiece where they bombard the workpiece and produce etching and/or cleaning of the exposed surface area.

As indicated above, the workpiece may include a dielectric material as one of the layers of the thin film. When this is so, extra care must be given to the nature and parameters of the alternative voltage that is used, and to the details of the electrical circuit through which it is applied, in order that no significant average voltage is built up across the dielectric layer. Basically, the problem arises due to the fact that an electron is much more mobile than an ion. This means that there is a much greater flow of electrons to the workpiece, when the latter is at a positive potential relative to the plasma, as compared to the flow of ions when the workpiece is at a negative potential relative to the plasma. As a consequence of this disparity in the mobilities of an ion and an electron, an alternating voltage having an average value of zero, such as a simple sinusoidal wave, produces a net average voltage across the dielectric film.

When it appears that the resulting voltage buildup may be dangerously near the dielectric breakdown voltage, one or both of the following precautions are advantageously taken. The first of these precautions is to include a blocking capacitor in series with the workpiece. The blocking capacitor can take the form of a second dielectric layer 30 included between the workpiece and the connection to the periodic voltage supply as shown in FIG. 2. The inclusion in the circuit of a blocking capacitor results in a sharing of the average voltage buildup between the two dielectrics. In particular, if the capacitance of the capacitor formed by the second dielectric 30 is smaller than the capacitance of the capacitor formed by the dielectric layer, a greater proporton of the average voltage appears across dielectric 30.

The second precaution that can be taken for reducing the voltage buildup across the dielectric layer is to use an alternating voltage that has a low average negative voltage. This has the effect of compensating for the lower ion mobility.

Figure 3:
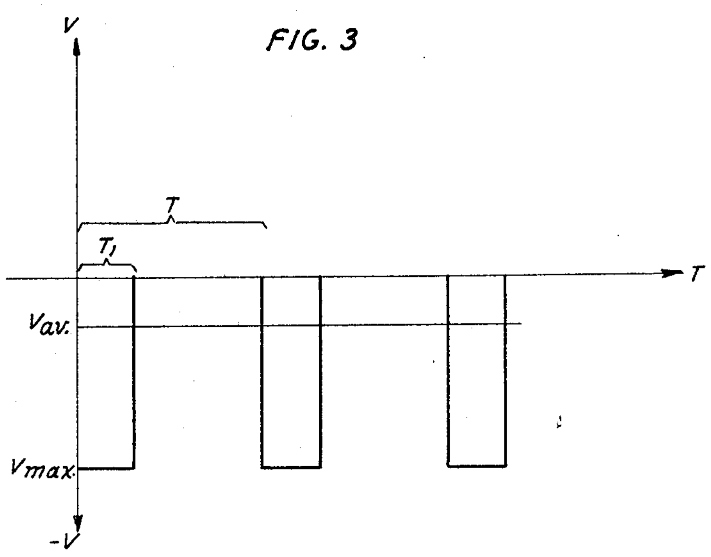
FIG. 3 is a graph illustrating features of a preferred voltage waveform suitable for application between the workpiece and the plasma.

FIG. 3 illustrates a typical voltage waveform which has a negative average value and is suitable for use in connection with the invention. The periodic voltage shown comprises a train of negative pulses having a pulse peak, $V_{max}$, a pulse duration, $t_1$, and a period, T. So long as the average voltage is less than a few hundred volts, typical dielectric layers are not damaged. It is understood, however, that the maximum permissible average in any instance depends upon the nature of the dielectric material and its thickness. A particularly advantageous negative pulse voltage is obtained when the pulse peak is chosen with reference to the yield curve of the material to be etched so that the amount of etching is maximized.

Figure 4:
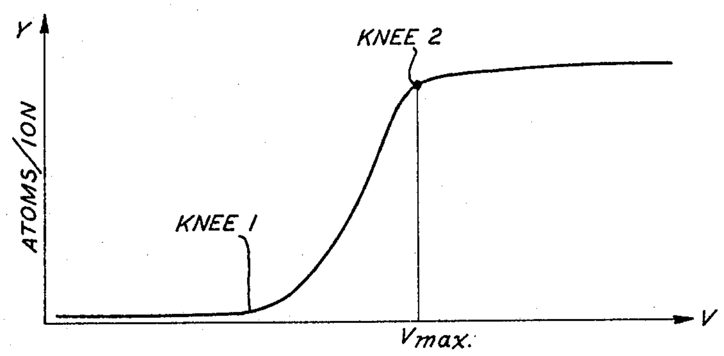
FIG. 4 is a graph of the ion-induced etching of a typical material as a function of the voltage between the workpiece and the plasma.

FIG. 4 illustrates a typical etching yield curve. The Y-axis indicates the yield of atoms etched per bombarding ion, while the V-axis indicates the ion energy in volts. The curve is typified by three regions. As ion energy is increased, the curve passes through a first region of low yield until the ion energy is increased beyond a first knee (knee 1). This low yield region is followed by a second region of rapidly increasing yield until a second knee (knee 2) is reached. Beyond knee 2 is an upper plateau region in which the yield continues to increase but at a much slower rate. Thus, one can maximize the amount of etching per unit of average voltage by choosing a peak voltage for the negative pulse that is approximately equal to the voltage at the low end of the upper plateau of the yield curve, i.e., near knee 2.

In order to minimize the output voltage requirements of the periodic voltage supply 31, the impedance of the workpiece is advantageously made small. Since this impedance is primarily capacitive when a dielectric layer is present, it has been found advantageous to use a high frequency voltage source. In practice it has been found that the range of frequencies between 100 kilocycles and 10 megacycles is satisfactory.

An idea of the relative magnitudes of the parameters appropriate for use in accordance with the embodiment of the invention may be obtained by consideration of one set of parameters used in a typical operation.

In one example a 2000 angstrom thickness was removed from a film of $SiO_2$ disposed on a one inch diameter slice of silicon in ten minutes. The ambient used in this example was argon at a pressure of 10 microns. The voltage applied between the filament and the anode was 50 volts. A 0.02 microfarad blocking capacitor was placed in series with the workpiece, and the waveform applied between the capacitor and ground (the workpiece being between the two) was a negative pulse train having a peak voltage of approximately −1500 volts at frequency of 150 kilocycles per second.

It is understood that the example described above is merely intended to be illustrative. Many other combina-bination being dependent upon the particular require-binations of parameters within the previously described ranges have been successfully employed; the exact combination being dependent upon the particular requirements of each case.

Figure 5:
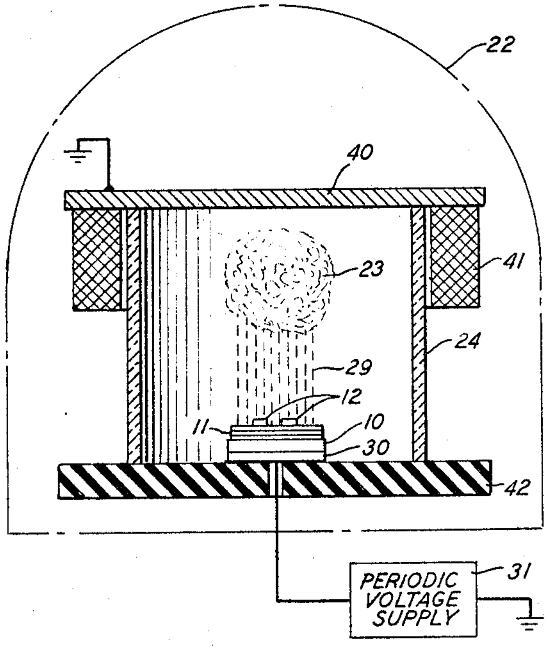

FIG. 5 is a schematic illustration of an alternative apparatus which can be used for the invention. The apparatus differs from that shown in FIG. 2 chiefly in that the filament and the anode of FIG. 2 have been eliminated and in that a grounded metal electrode 40 has been added. In this apparatus the workpiece is supported on an insulating base 42 in a vacuum chamber 22. A quartz cylinder 24 surrounding the workpiece is also supported by the insulator, and a grounded metal electrode is placed across the opposite end of the cylinder. A ring magnet 41 is placed around the cylinder 24 above the workpiece.

In this apparatus, a plasma 23 is formed by collisions between excited electrons and the ambient gas atoms rather than by collisions involving filament-emitted electrons, as in the apparatus of FIG. 2. When the gas is at a sufficiently high pressure, the application of a periodic voltage between electrode 40 and the workpiece causes sufficient movement of the electrons to form a plasma. However, the plasma may advantageously be formed at a lower pressure by the addition of magnets for concentrating the electron movement. Thus, for example, in FIG. 5 ring magnet 41 can be used to establish a magnetic field in the direction of the electric field. Such a magnetic field concentrates the electron movement and the resulting plasma within the central region of the ring. An advantage in forming the plasma in this manner is its simplicity. The need for a separate electron source is eliminated, and a more nearly uniform plasma is generated. Etching or cleaning can be carried out in substantially the same manner as described previously.

In the discussion thus far, cleaning and etching of a workpiece have been considered. As previously mentioned, an important application of the invention is in the formation of an atomically clean bond between a workpiece surface and another material.

The present invention is particularly suited to dealing with the problem of unwanted surface layers and is especially useful where the workpiece contains one or more dielectric layers. In accordance with this use of the invention, the surface layer is removed and prevented from reforming prior to deposition. This is done by depositing the material either at the same time the surface layer is being removed, or immediately afterward, but before the workpiece is exposed to air. Known techniques such as, for example, sputtering or vacuum evaporation can be used to deposit the material on the cleaned surface.

Figure 6:
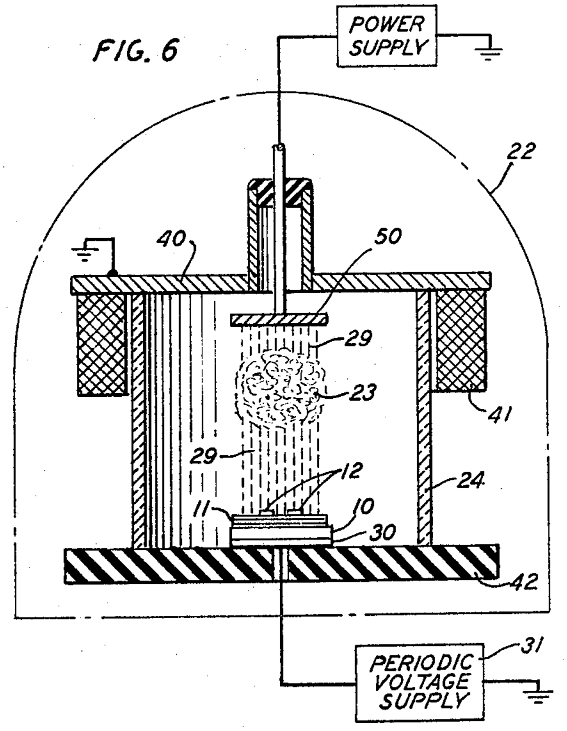

FIG. 6 illustrates apparatus which can be used to atomically clean a workpiece surface and deposit a layer of material onto it. The apparatus differs from that shown in FIG. 5 chiefly in that a sputtering electrode 50 of the material to be deposited is placed in the quartz container 24 facing the workpiece. The sputtering electrode is connected to its own separate power supply, which can be either alternating or direct current.

Cleaning of the workpiece is accomplished by ionic bombardment in the manner described above. Material is sputtered onto the workpiece from the sputtering electrode 50 either immediately after the cleaning process or, advantageously, at the same time that the cleaning is taking place. The advantages of simultaneous cleaning and sputtering are that there is no time for a surface film to form and that the more loosely bound atoms of sputtered material are knocked off the workpiece while the more tightly bound atoms remain. The result is a denser and more strongly adherent contact.

Figure 7:
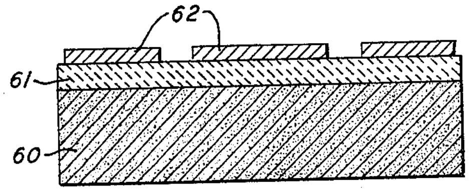
FIG. 7 is a typical workpiece upon which an atomically clean bond is to be formed in accordance with the invention.

One example of this atomically clean bonding is the formation of a platinum-silicon contact. FIG. 7 illustrates a typical workpiece comprising a silicon substrate 60 upon which there is shown disposed a passivating oxide film 61 and a masking layer 62 such as photoresist or a metal having a high sputtering threshold.

An atomically clean contact is formed by first back sputtering the workpiece so that the silicon substrate is exposed and then sputtering metal from a platinum sputtering electrode onto the workpiece. Back sputtering can be carried out at a reduced rate while the sputtering is taking place in order to achieve a cleaner, more adherent bond. By either carefully controlling the energy with which the sputtered platinum atoms reach the silicon or heating the silicon substrate (heater not shown), an atomically clean ohmic contact or barrier layer of platinum silicide may be obtained. When the material is to be sputtered after the cleaning process, cleaning is first produced by grounding the sputtering electrode 50 and applying a periodic voltage to the workpiece. After the workpiece is cleaned, it is disconnected from the power supply or grounded, and an alternating current or a direct current negative voltage is applied between the sputtering electrode and ground. When it is desired to clean and sputter simultaneously, the periodic voltage is applied between the workpiece and ground, and the alternating current or negative direct current voltage is simultaneously applied between the sputtering electrode and ground. Adjustment of the two voltages allows one to adjust the relative cleaning and sputtering rates. Thus, one can proceed from a process involving net removal of material from the workpiece to one involving net arrival of material from the electrode 50 onto the workpiece.

Figure 8:
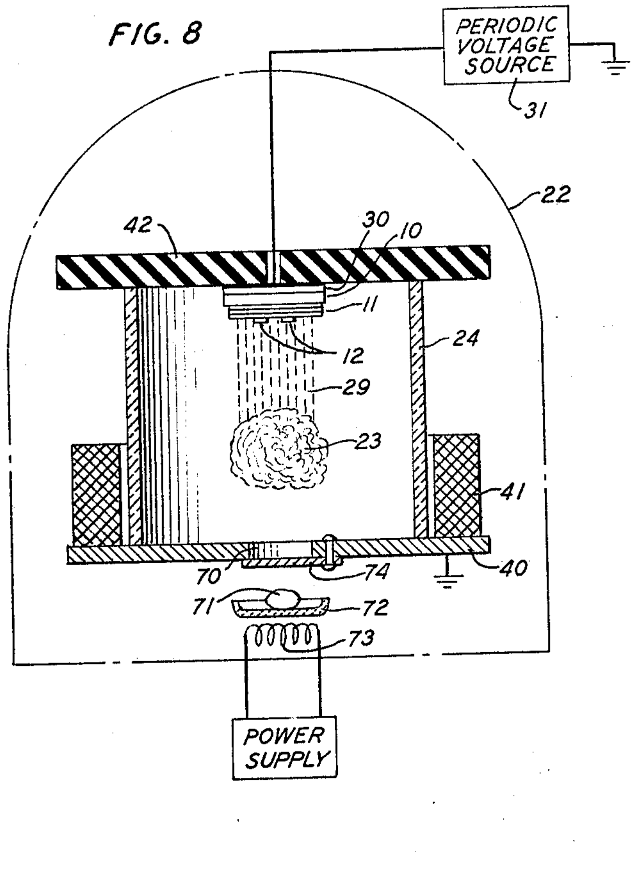

FIG. 8 illustrates an alternative apparatus for forming an atomically clean bond. The apparatus differs from that shown in FIG. 5 chiefly in that means are provided for depositing material upon the workpiece by vacuum evaporation. An aperture 70 is placed in the grounded metal electrode 40 so that the workpiece is exposed to evaporated atoms from a sample 71 of the material to be deposited. Typically, the sample is placed in a container 72 such as a boat or crucible in thermal contact with a heating means 73, such as a high resistance filament connected to a power supply (not shown) or an electron gun. Advantageously, a removable cover 74 is provided so that the aperture 70 can be opened and closed from outside the vacuum chamber 22.

The atomically clean bonding is produced by the steps of cleaning the workpiece by back sputtering, further evacuating the chamber 22 so as to reduce the pressure, and evaporating the sample 71 onto the exposed workpiece surface by applying power to the filament 73. Advantageously, the aperture 70 is closed by the cover 74 during the back sputtering process and opened shortly after the sample begins to evaporate. Typically, time is allowed for impurities to evaporate off the sample 71 before the cover 74 is removed.

It is understood that the above-described arrangements are simply illustrative of the many possible specific embodiments which can represent applications of the principles of the invention. Numerous and varied other arrangements can readily be devised in accordance with these principles by those skilled in the art without departing from the spirit and scope of the invention.

What is claimed is:

1. A method of treating a surface of a workpiece including at least one layer of dielectric material comprising the steps of placing the workpiece in a low pressure ambient of a noble gas, ionizing the noble gas to form a plasma, and establishing a periodic voltage difference where said periodic voltage is a high frequency negative pulse train having an average value such that the voltage across any of said dielectric layers in the workpiece is less than the breakdown voltage of the dielectric between the workpiece and the plasma for a time sufficient to etch the surface of the workpiece by a desired amount.

2. The method according to claim 1 including the step of placing a blocking capacitor between said workpiece and the voltage source.

3. The method for depositing a layer of material onto an atomically clean workpiece by the steps of masking the surface of said workpiece, etching in accordance with the method of claim 1, and depositing a layer of said material onto the etched surface.

4. The method according to claim 3 wherein said material is deposited upon said workpiece surface at the same time said surface is being cleaned.

5. The method according to claim 3 wherein said material is deposited upon said workpiece by the process of sputtering.

6. The method according to claim 3 wherein said material is deposited upon said workpiece by the process of vacuum evaporation.

7. The method according to claim 3 wherein said material is platinum and said workpiece includes a layer of silicon, and wherein said platinum is deposited upon said silicon by the process of sputtering.

8. The method according to claim 1 wherein the portion of said workpiece that is to be etched or cleaned comprises a material having an etching yield curve characterized by first region of low yield, a second region of increasing yield and an upper plateau region of relatively constant yield; and wherein the peak value of said negative pulse voltage is near the low voltage end of said upper plateau region of said yield curve.

9. The method according to claim 1 wherein the rate of etching is controlled by "bleeding" oxygen into said noble gas ambient.

References Cited

UNITED STATES PATENTS

| | | | |
|---|---|---|---|
| 3,021,271 | 2/1962 | Wehner | 204—192 |
| 3,210,263 | 10/1965 | Jones | 204—192 |
| 3,282,814 | 11/1962 | Berghaus | 204—192 |
| 3,287,243 | 11/1966 | Ligenza | 204—192 |
| 3,271,286 | 9/1966 | Lepselter | 204—192 |
| 2,163,480 | 6/1939 | Burkhardt et al. | 204—192 |

OTHER REFERENCES

"Sputtering of Dielectrics by High-Frequency Fields," by Anderson et al., J. of Applied Physics, vol. 33, No. 10, pp. 2991–2992.

JOHN H. MACK, Primary Examiner

SIDNEY S. KANTER, Assistant Examiner

U.S. Cl. X.R.

204—298